United States Patent
Wu et al.

(10) Patent No.: US 10,692,941 B2
(45) Date of Patent: Jun. 23, 2020

(54) ORGANIC LIGHT EMITTING DIODE DISPLAY

(71) Applicant: Shenzhen China Star Optoelectronics Semiconductor Display Technology Co., Ltd., Shenzhen (CN)

(72) Inventors: Yuanchun Wu, Shenzhen (CN); Wei Yuan, Shenzhen (CN); Shibo Jiao, Shenzhen (CN)

(73) Assignee: Shenzhen China Star Optoelectronics Semiconductor Display Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 16/311,678

(22) PCT Filed: Sep. 26, 2018

(86) PCT No.: PCT/CN2018/107771
§ 371 (c)(1),
(2) Date: Dec. 20, 2018

(87) PCT Pub. No.: WO2020/015173
PCT Pub. Date: Jan. 23, 2020

(65) Prior Publication Data
US 2020/0027928 A1    Jan. 23, 2020

(30) Foreign Application Priority Data
Jul. 20, 2018  (CN) .......................... 2018 1 0806781

(51) Int. Cl.
*H01L 27/32* (2006.01)
*H01L 51/50* (2006.01)

(52) U.S. Cl.
CPC ........ *H01L 27/322* (2013.01); *H01L 51/5044* (2013.01)

(58) Field of Classification Search
CPC .......................... H01L 27/322; H01L 51/5044
See application file for complete search history.

(56) References Cited

U.S. PATENT DOCUMENTS

| 8,159,426 B2 * | 4/2012 | Chang | G09G 3/3208 |
| | | | 313/463 |
| 9,088,003 B2 * | 7/2015 | Gupta | H01L 51/5203 |

(Continued)

FOREIGN PATENT DOCUMENTS

| CN | 105527667 A | 4/2016 |
| CN | 105720201 A | 6/2016 |

(Continued)

*Primary Examiner* — Dale E Page
*Assistant Examiner* — Quovaunda Jefferson
(74) *Attorney, Agent, or Firm* — Leong C. Lei (57) ABSTRACT

Provided is an organic light emitting diode display. The OLED display includes a thin film transistor substrate, a white OLED layer, a quantum dot photoluminescence film and a color filter film. The OLED display includes sub-pixels, which are sequentially disposed. The sub-pixels include a red sub-pixel, a green sub-pixel and a blue sub-pixel. A region of the quantum dot photoluminescence film corresponding to the red sub-pixel is provided with red quantum dots, and a region corresponding to the green sub-pixel is provided with green quantum dots. The red quantum dots and the green quantum dots are excited by white light emitted by the WOLED layer to emit high-purity red light and green light, respectively, and then filtered by the color filter film to be emitted. Thus, the OLED display has higher color saturation, which effectively broadens color gamut and can fully utilize the short-wavelength light.

8 Claims, 4 Drawing Sheets

(56) References Cited

U.S. PATENT DOCUMENTS

| | | | | |
|---|---|---|---|---|
| 2003/0127656 A1* | 7/2003 | Aizawa | ............... | H01L 51/5262 |
| | | | | 257/79 |
| 2012/0097989 A1* | 4/2012 | Lee | .................... | H01L 51/5278 |
| | | | | 257/88 |
| 2015/0301408 A1* | 10/2015 | Li | .................... | G02F 1/133621 |
| | | | | 362/84 |
| 2016/0093677 A1* | 3/2016 | Tseng | .................... | G02B 5/201 |
| | | | | 362/84 |
| 2016/0155950 A1* | 6/2016 | Kim | .................... | H01L 51/5084 |
| | | | | 257/40 |

FOREIGN PATENT DOCUMENTS

| | | |
|---|---|---|
| CN | 106898628 A | 6/2017 |
| CN | 107482126 A | 12/2017 |

* cited by examiner

ORGANIC LIGHT EMITTING DIODE DISPLAY

FIELD OF THE INVENTION

The present invention relates to a display technology field, and more particularly to an OLED display.

BACKGROUND OF THE INVENTION

The active matrix panel display elements possess many merits of thin frame, power saving, no radiation, etc. and have been widely used. The Organic Light Emitting Diode (OLED) display technology is a flat panel display technology which has great prospects for development. It possesses extremely excellent display performance, and particularly the properties of self-illumination, simple structure, ultra thin, fast response speed, wide view angle, low power consumption and capability of realizing flexible display, and therefore is considered as the "dream display". Meanwhile, the investment for the production equipments is far smaller than the Thin Film Transistor-Liquid Crystal Display (TFT-LCD). It has been favored by respective big display makers and has become the main selection of the third generation display element of the display technology field. At present, the OLED has reached the point before mass production. With the further research and development, the new technologies constantly appear, and someday, there will be a breakthrough for the development of the OLED display elements.

The prior art mainly uses a structure in which a white organic light emitting diode (WOLED) and a color filter (CF) are stacked to realize full color of the OLED display device. The current WOLED mainly uses a two-layer laminated structure of blue plus yellow light emitting layer or three-layer laminated structure of blue plus red plus green light emitting layer to realize white light. The white light spectrum is wider. When the white light is separated into three primary colors by using a color filter, since the spectrum of red light and green light is wider, the color purity of red light and green light is lower, and the color gamut of the WOLED display is not wide enough. Meanwhile, when the white light is separated into red light and green light by using the color filter, only the red light and the green light in the white light spectrum can be utilized, and the energy loss of the blue light in the white light spectrum is large, and the energy utilization rate is low, resulting in the higher energy consumption of the WOLED display.

Quantum Dot (QD) refers to a semiconductor crystal grain having a particle diameter of 1-100 nm. Since the particle size of QD is small, the quantum Boolean effect is smaller or closer to the exciton Bohr radius of the corresponding material, and the continuous energy band structure of the material is transformed into a discrete energy level structure. Under the excitation of the external light source, the electrons will have transition and emit fluorescence. QD's special discrete energy level structure makes the half-wave width thereof narrower, so QD can emit high-purity monochromatic light, which has higher luminous efficiency than traditional displays. Meanwhile, since the band gap of the QD is greatly affected by the size of the QD, and the light of different wavelengths can be excited by adjusting the size of the QD or using QDs of different compositions.

SUMMARY OF THE INVENTION

An objective of the present invention is to provide an organic light emitting diode (OLED) display with high color saturation, wide color gamut, high energy utilization rate and low power consumption.

For realizing the aforesaid objective, the present invention provides an organic light emitting diode display, comprising a thin film transistor substrate, a white organic light emitting diode layer disposed on one side of the thin film transistor substrate, a quantum dot photoluminescence film disposed on one side of the thin film transistor substrate away from the white organic light emitting diode layer or on one side of the white organic light emitting diode layer away from the thin film transistor substrate and a color filter film disposed on one side of the quantum dot photoluminescence film away from the white organic light emitting diode layer; wherein the quantum dot photoluminescence film is located on a light exit side of the white organic light emitting diode layer;

wherein the organic light emitting diode display comprises a plurality of sub-pixels arranged in sequence, and the plurality of sub-pixels comprise a red sub-pixel, a green sub-pixel and a blue sub-pixel;

wherein a region of the quantum dot photoluminescence film corresponding to the red sub-pixel is provided with red quantum dots, and a region corresponding to the green sub-pixel is provided with green quantum dots;

wherein the color filter film comprises a red color resistance, a green color resistance, and a blue color resistance respectively corresponding to the red sub-pixel, the green sub-pixel and the blue sub-pixel.

The quantum dot photoluminescence film comprises a first substrate, a first black matrix disposed on the first substrate, a red quantum dot pattern and a green quantum dot pattern; the first black matrix is provided with a plurality of first openings corresponding to the plurality of sub-pixels; the red quantum dot pattern is disposed in the first opening of the first black matrix corresponding to the red sub-pixel, and the green quantum dot pattern is disposed in the first opening of the first black matrix corresponding to the green sub-pixel;

the red quantum dot pattern comprises a first polymer material and the red quantum dots doped in the first polymer material; the green quantum dot pattern comprises a second polymer material and the green quantum dots doped in the second polymer material.

The color filter film further comprises a second substrate and a second black matrix, and the second black matrix is disposed on the second substrate and are provided with a plurality of second openings corresponding to the plurality of sub-pixels, and the red color resistance, the green color resistance and the blue color resistance are all disposed on the second substrate, and the red color resistance is disposed in the second opening of the second black matrix corresponding to the red sub-pixel, and the green color resistance is disposed in the second opening of the second black matrix corresponding to the green sub-pixel, and the blue color resistance is disposed in the second opening of the second black matrix corresponding to the blue sub-pixel.

The plurality of sub-pixels further comprises a white sub-pixel.

The organic light emitting diode display further comprises a polarizer disposed on one side of the color filter film away from the white organic light emitting diode layer.

The organic light emitting diode display further comprises an encapsulation layer disposed on one side of the white organic light emitting diode layer away from the thin film transistor substrate;

wherein as the quantum dot photoluminescence film is disposed on one side of the white organic light emitting diode layer away from the thin film transistor substrate, the encapsulation layer is disposed between the white organic light emitting diode layer and the quantum dot photoluminescence film.

Optionally, the white organic light emitting diode layer comprises an anode, a hole injection layer, a first hole transport layer, a first light emitting layer, a first electron transport layer, an electron generation layer, a hole generation layer, a second hole transport layer, a second light emitting layer, a second electron transport layer, an electron injection layer and a cathode, which are sequentially disposed.

One of the first light emitting layer and the second light emitting layer is a yellow light emitting layer and the other is a blue light emitting layer; or one of the first light emitting layer and the second light emitting layer is a mixed light emitting layer of red light and green light and the other is a blue light emitting layer;

wherein the thin film transistor substrate is located on one side of the anode away from the cathode; or the thin film transistor substrate is located on one side of the cathode away from the anode.

Optionally, the white organic light emitting diode layer comprises an anode, a hole injection layer, a first hole transport layer, a first light emitting layer, a first electron transport layer, a first electron generation layer, a first hole generation layer, a second hole transport layer, a second light emitting layer, a second electron transport layer, a second electron generation layer, a second hole generation layer, a third hole transport layer, a third light emitting layer, a third electron transport layer, an electron injection layer and a cathode, which are sequentially disposed.

The first light emitting layer and the third light emitting layer are both blue light emitting layers, and the second light emitting layer is a yellow light emitting layer; or the first light emitting layer, the second light emitting layer and the third light emitting layer respectively are one of a red light emitting layer, a green light emitting layer and a blue light emitting layer, and colors of the lights emitted by the first light emitting layer, the second light emitting layer and the third light emitting layer are different;

wherein the thin film transistor substrate is located on one side of the anode away from the cathode; or the thin film transistor substrate is located on one side of the cathode away from the anode.

The benefits of the present invention are: the present invention provides an OLED display including a thin film transistor substrate, a white OLED layer, a quantum dot photoluminescence film and a color filter film. The OLED display includes a plurality of sub-pixels, which are sequentially arranged. The sub-pixels include a red sub-pixel, a green sub-pixel and a blue sub-pixel. A region of the quantum dot photoluminescence film corresponding to the red sub-pixel is provided with red quantum dots, and a region corresponding to the green sub-pixel is provided with green quantum dots. The red quantum dots and the green quantum dots are excited by white light emitted by the WOLED layer to emit high-purity red light and green light, respectively, and then filtered by the color filter film to be emitted. Thus, the OLED display has higher color saturation, which effectively broadens color gamut of the OLED display and can fully utilize the short-wavelength light in the white light, thereby improving the energy utilization rate and making the OLED display have lower power consumption.

BRIEF DESCRIPTION OF THE DRAWINGS

In order to better understand the characteristics and technical aspect of the invention, please refer to the following detailed description and accompanying drawings of the present invention. However, the drawings are provided for reference only and are not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
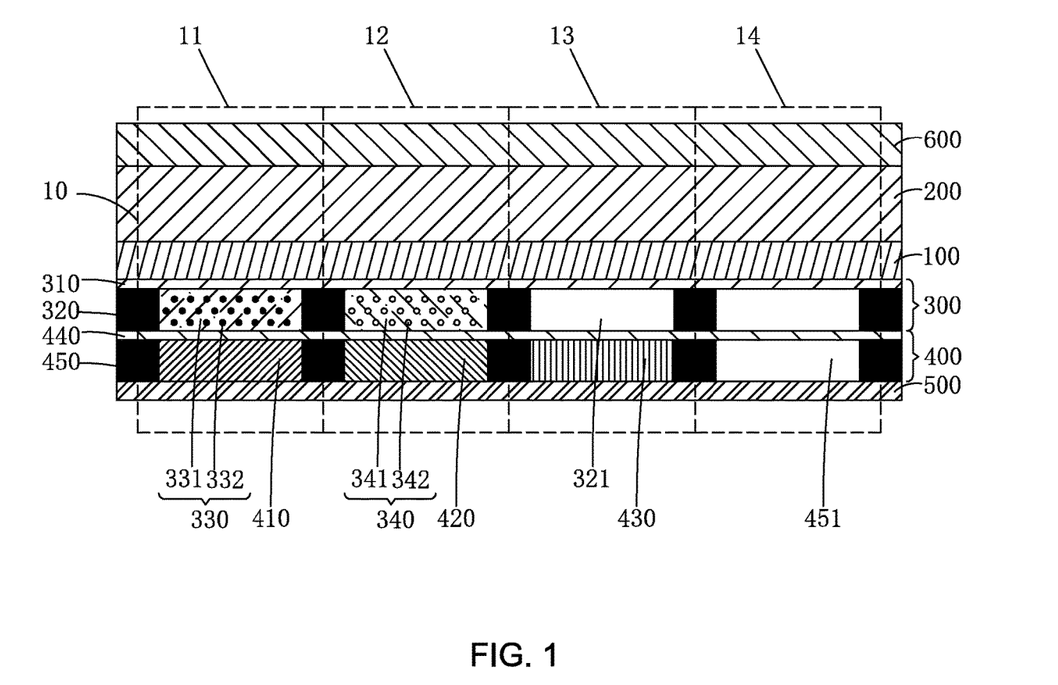
FIG. 1 is a structural diagram of the first embodiment of an organic light emitting diode display of the present invention.

Please refer to FIG. 1, which is a structural diagram of the first embodiment of an organic light emitting diode display of the present invention. The first embodiment of an organic light emitting diode display of the present invention includes a thin film transistor substrate 100, a white organic light emitting diode layer 200 disposed on one side of the thin film transistor substrate 100, a quantum dot photoluminescence film 300 disposed on one side of the thin film transistor substrate 100 away from the white organic light emitting diode layer 200 and a color filter film 400 disposed on one side of the quantum dot photoluminescence film 300 away from the white organic light emitting diode layer 200.

The quantum dot photoluminescence film 300 is located on a light exit side of the white organic light emitting diode layer 200. Namely, the first embodiment of the OLED display of the present invention is a bottom emission type OLED display, and the WOLED layer 200 emits light from a side thereof adjacent to the TFT substrate 100.

The organic light emitting diode display comprises a plurality of sub-pixels 10 arranged in sequence, and the plurality of sub-pixels 10 comprise a red sub-pixel 11, a green sub-pixel 12, a blue sub-pixel 13 and a white sub-pixel 14. A region of the quantum dot photoluminescence film 300 corresponding to the red sub-pixel 11 is provided with red quantum dots 332, and a region corresponding to the green sub-pixel 12 is provided with green quantum dots 342. The color filter film 400 includes a red color resistance 410, a green color resistance 420 and a blue color resistance 430 respectively corresponding to the red sub-pixel 11, the green sub-pixel 12 and the blue sub-pixel 13.

Specifically, the TFT substrate 100 includes a substrate (not shown) and a TFT array (not shown) provided on the substrate, and the TFT array is disposed between the substrate and the WOLED layer 200.

Further, the substrate material of the TFT substrate 100 may be, but not limited to, glass and flexible polyimide (PI), and the TFT in the TFT array of the TFT substrate 100 may be, but not limited to, indium gallium zinc oxide. (IGZO) TFT, low temperature polysilicon (LTPS) TFT and amorphous silicon (a-Si) TFT.

Figure 2:
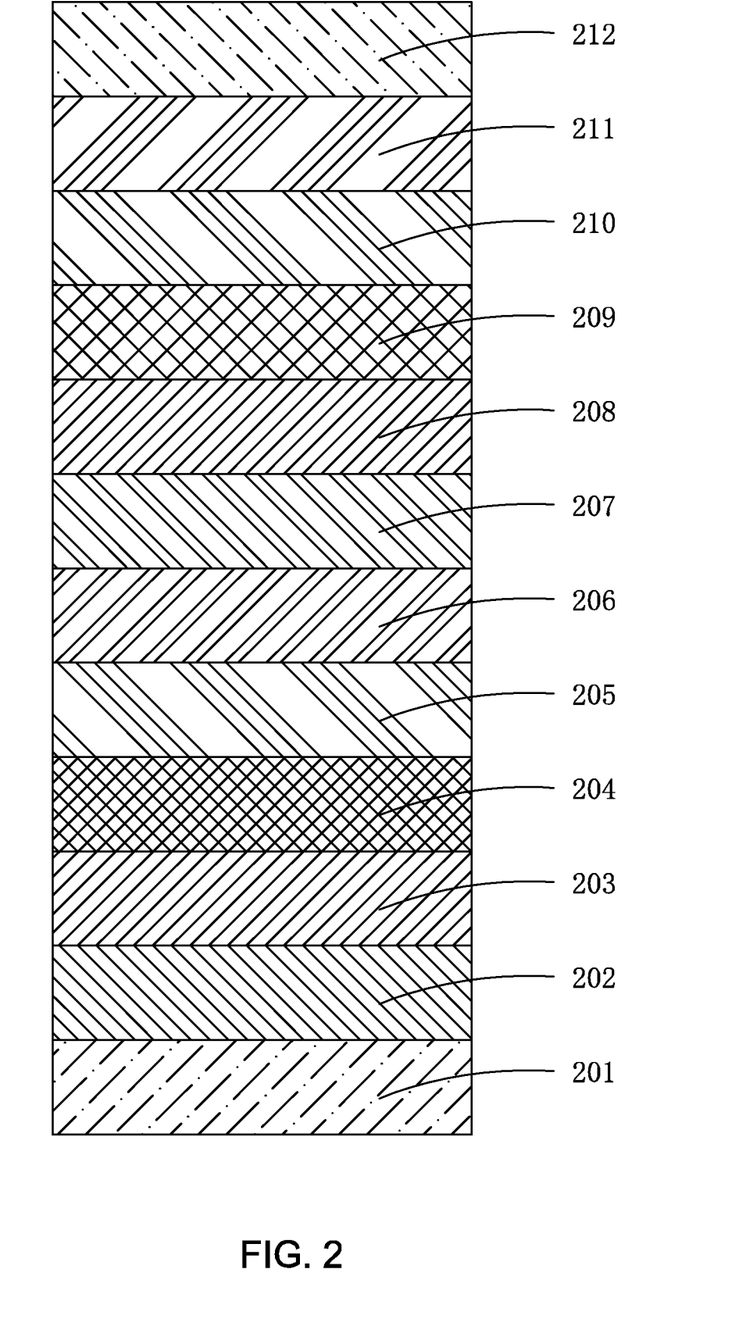
FIG. 2 is a structural diagram of a preferred embodiment of a white organic light emitting diode layer of an organic light emitting diode display of the present invention.

Specifically, referring to FIG. 2, in one preferred embodiment of the present invention, the WOLED layer 200 includes an anode 201, a hole injection layer 202, a first hole transport layer 203, a first light emitting layer 204, a first electron transport layer 205, an electron generation layer 206, a hole generation layer 207, a second hole transport layer 208, a second light emitting layer 209, a second electron transport layer 210, an electron injection layer 211 and a cathode 212.

Optionally, the TFT substrate 100 is located on one side of the anode 201 away from the cathode 212. Namely, the multilayer structure of the WOLED layer 200 is sequentially disposed from the anode 201 to the cathode 212 on one side of the TFT substrate 100. Then, the WOLED layer 200 is a non-inverted WOLED device structure. Alternatively, the TFT substrate 100 may be located on one side of the cathode 212 away from the anode 201. Namely, the multilayer structure of the WOLED layer 200 is sequentially disposed from the cathode 212 to the anode 201 on one side of the TFT substrate 100. Then, the WOLED layer 200 is an inverted WOLED device structure.

Optionally, one of the first light emitting layer 204 and the second light emitting layer 209 is a yellow light emitting layer and the other is a blue light emitting layer. The yellow light and the blue light emitted by the first light emitting layer 204 and the second light emitting layer 209 are mixed, so that the WOLED layer 200 emits white light. Alternatively, one of the first light emitting layer 204 and the second light emitting layer 209 is a mixed light emitting layer of red light and green light and the other is a blue light emitting layer. The first light emitting layer 204 and the second light emitting layer 209 emit red light, blue light, green light and are mixed, so that the WOLED layer 200 emits white light.

Furthermore, the anode 201 may have a structure of two layers of indium tin oxide plus a layer of silver, and a thickness of the silver may be selected from 110 nm to 120 nm, and preferably 115 nm. A material of the hole injection layer 202 is 2,3,6,7,10,11-hexacyano-1,4,5,8,9,12-hexaazatriphenylene (HATCN). A material of the first hole transport layer 203 and the second hole transport layer 208 is N,N'-diphenyl-N,N'-(1-naphthyl)-1,1'-biphenyl-4,4'-Diamine (NPB). A material of the first electron transport layer 205 and the second electron transport layer 210 is 1,3,5-tris(1-phenyl-1H-benzimidazol-2-yl)benzene (TPBi). A material of the electron generation layer 206 is lithium doped 4,7-diphenyl-1,10-phenanthroline (BPhen:Li). A material of the hole generation layer 207 is HATCN. A material of the electron injection layer 211 is (8-hydroxyquinoline) lithium (Liq). A material of the cathode 212 may be aluminum (Al). When the first light emitting layer 204 and the second light emitting layer 209 are blue light emitting layers, the material is selected from bis(4,6-difluorophenylpyridine-C2,N) pyridine hydrazide (Flrpic). In the case of the yellow light-emitting layer, the material is selected from pigment PO-48, and in the case of the mixed light emitting layer of red light and green light, the material can be selected from a common red and green electroluminescent material.

Figure 3:
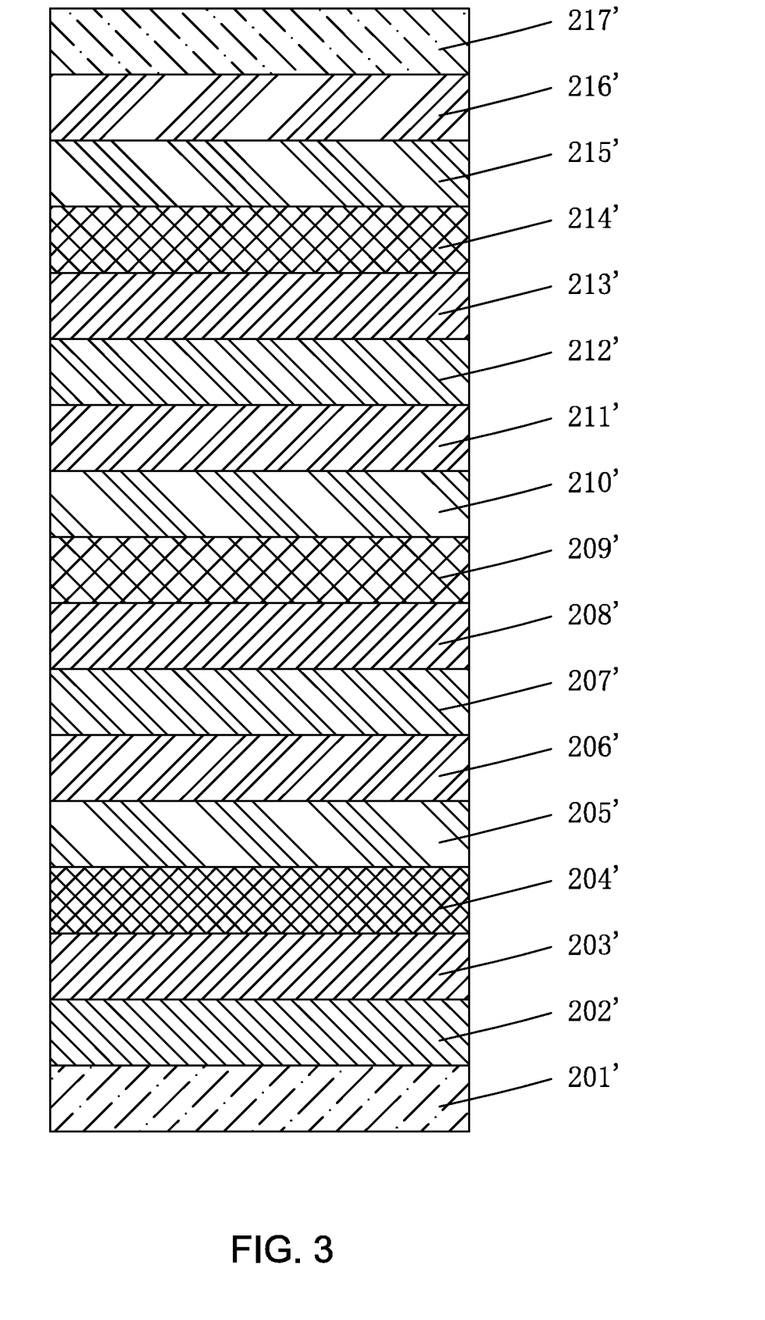
FIG. 3 is a structural diagram of another preferred embodiment of a white organic light emitting diode layer of an organic light emitting diode display of the present invention.

Specifically, referring to FIG. 3, in another preferred embodiment of the present invention, the WOLED layer 200 includes an anode 201', a hole injection layer 202', a first hole transport layer 203', a first light emitting layer 204', a first electron transport layer 205', and a first electron generation layer 206', a first hole generation layer 207', a second hole transport layer 208', a second light emitting layer 209', a second electron transport layer 210', a second electron generation layer 211', a second hole generation layer 212', a third hole transport layer 213', a third light emitting layer 214', a third electron transport layer 215', an electron injection layer 216' and a cathode 217'.

Optionally, the TFT substrate 100 is located on one side of the anode 201' away from the cathode 217'. Namely, the multilayer structure of the WOLED layer 200 is sequentially disposed from the anode 201' to the cathode 217' on one side of the TFT substrate 100. Then, the WOLED layer 200 is a non-inverted WOLED device structure. Alternatively, the TFT substrate 100 may be located on one side of the cathode 217' away from the anode 201'. Namely, the multilayer structure of the WOLED layer 200 is sequentially disposed from the cathode 217' to the anode 201' on one side of the TFT substrate 100. Then, the WOLED layer 200 is an inverted WOLED device structure.

Optionally, the first light emitting layer 204' and the third light emitting layer 214' are both blue light emitting layers, and the second light emitting layer 209' is a yellow light emitting layer, and the first light emitting layer 204' and the blue light emitted by the third light emitting layer 214' is mixed with the yellow light emitted by the second light emitting layer 209', so that the WOLED layer 200 emits white light. Alternatively, first light emitting layer 204', the second light emitting layer 209', and the third light emitting layer 214' respectively are one of a red light emitting layer, a green light emitting layer, and a blue light emitting layer. The colors of lights emitted by the first light emitting layer 204', the second light emitting layer 209' and the third light emitting layer 214' are different, and the red light, the blue light and the green light emitted by the first light emitting layer 204', the second light emitting layer 209' and the third light emitting layer 214' are mixed, so that the WOLED layer 200 emits white light.

Furthermore, the anode 201' may have a structure of two layers of indium tin oxide plus a layer of silver, and a thickness of the silver may be selected from 11 Onm to 120 nm, and preferably 115 nm. A material of the hole injection layer 202' is HATCN. A material of the first hole transport layer 203', the second hole transport layer 208' and the third hole transport layer 213' is NPB.A material of the first electron transport layer 205', the second electron transport layer 210' and the third electron transport layer 215' is TPBi. A material of the first electron generation layer 206' and the second electron generation layer 211' is BPhen:Li. A material of the first hole generation layer 207' and the second hole generation layer 212' is HATCN. A material of the electron injection layer 216' is Liq. A material of the cathode 217' may be Al. When the first light emitting layer 204', the second light emitting layer 209' and the third light emitting layer 214' are blue light emitting layers, the material is selected from Firpic. In the case of the yellow light emitting layer, the material is selected from pigment PO-48, and in the case of the mixed light emitting layer of red light and green light, the material can be selected from a common red and green electroluminescent material.

Specifically, referring to FIG. 1, the quantum dot photoluminescence film 300 includes a first substrate 310, a first black matrix 320 disposed on the first substrate 310, a red quantum dot pattern 330 and a green quantum dot pattern 340. The first black matrix 320 is provided with a plurality of first openings 321 corresponding to the plurality of sub-pixels 10. The red quantum dot pattern 330 is disposed in the first opening 321 of the first black matrix 320 corresponding to the red sub-pixel 11, and the green quantum dot pattern 340 is disposed in the first opening 321 of the first black matrix 320 corresponding to the green sub-pixel 12. The first black matrix 320 does not have any structure in the first openings 321 corresponding to the blue sub-pixel 13 and the white sub-pixel 14.

Specifically, the one side of the quantum dot photoluminescence film 300 having the first substrate 310 can be configured to be a side close to the WOLED layer 200, and can also be configured to be a side away from the WOLED layer 200 without interfering the achievement of the present invention. In the embodiment shown in FIG. 1, the one side of the quantum dot photoluminescence film 300 having the first substrate 310 is configured to be a side close to the WOLED layer 200.

Specifically, the red quantum dot pattern 330 includes a first polymer material 331 and red quantum dots 332 doped in the first polymer material 331. The green quantum dot pattern 340 includes a second polymer material 341 and green quantum dots 342 doped in the second polymer material 341.

Specifically, the first polymer material 331 and the second polymer material 341 each may be selected from a polymer material having high transmittance commonly used in the prior art, for instance, styrene (PS), polycarbonate (PC), polypropylene (PP), polyethylene (PE) and polyvinyl chloride (PVC), polymethyl methacrylate (PMMA). The first polymer material 331 and the second polymer material 341 may be the same or different.

Specifically, when the quantum dot photoluminescence film 300 is fabricated, a black matrix material layer is first formed on the first substrate 310, and the black matrix material layer is subjected to an exposure and development process to obtain a first black matrix 320. Then, the first polymer material 331 doped with the red quantum dots 332 and the second polymer material 341 doped with the green quantum dots 342 are respectively formed by blade coating, spin coating or inkjet printing on the first openings 321 of the first black matrix 320 respectively corresponding to the red sub-pixel 11 and the green sub-pixel 12 to obtain the red quantum dot pattern 330 and the green quantum dot pattern 340.

Specifically, the color filter film 400 further includes a second substrate 440 and a second black matrix 450, and the second black matrix 450 is disposed on the second substrate 440 and are provided with a plurality of second openings 451 corresponding to the plurality of sub-pixels 10, and the red color resistance 410, the green color resistance 420 and the blue color resistance 430 are all disposed on the second substrate 440, and the red color resistance 410 is disposed in the second opening 451 of the second black matrix 450 corresponding to the red sub-pixel 11, and the green color resistance 420 is disposed in the second opening 451 of the second black matrix 450 corresponding to the green sub-pixel 12, and the blue color resistance 430 is disposed in the second opening 451 of the second black matrix 450 corresponding to the blue sub-pixel 13. The second black matrix 450 does not have any structure in the second opening 451 corresponding to the white sub-pixel 14.

Specifically, the one side of the color filter film 400 having the second substrate 440 can be configured to be a side close to the WOLED layer 200, and can also be configured to be a side away from the WOLED layer 200 without interfering the achievement of the present invention. In the embodiment shown in FIG. 1, the one side of the color filter film 400 having the second substrate 440 is configured to be a side close to the WOLED layer 200.

Specifically, the OLED display further includes a polarizer 500 disposed on one side of the color filter film 400 away from the white OLED layer 200 for eliminating surface light reflection of OLED display.

Specifically, the OLED display further includes an encapsulation layer 600 disposed on one side of the WOLED layer 200 away from the TFT substrate 100. The encapsulation layer 600 is used to prevent water oxygen from intruding into the WOLED layer 200, and the material thereof may be, but not limited to, glass, metal, alloy and silicon nitride (SiNx). The encapsulation layer 600 may be formed on the side of the WOLED layer 200 away from the TFT substrate 100 by a sealant package, a sealant package plus a filler, a glass powder laser melt package or a thin film package.

Specifically, in the first embodiment of the OLED display of the present invention, the WOLED layer 200 is first formed on the TFT substrate 100, and then the encapsulation layer 600 is formed on the WOLED layer 200, and then the quantum dot photoluminescence film 300, the color filter film 400 and the polarizer 500 are sequentially bonded to the side of the TFT substrate 100 away from the WOLED layer 200 to produce an OLED display.

Figure 4:
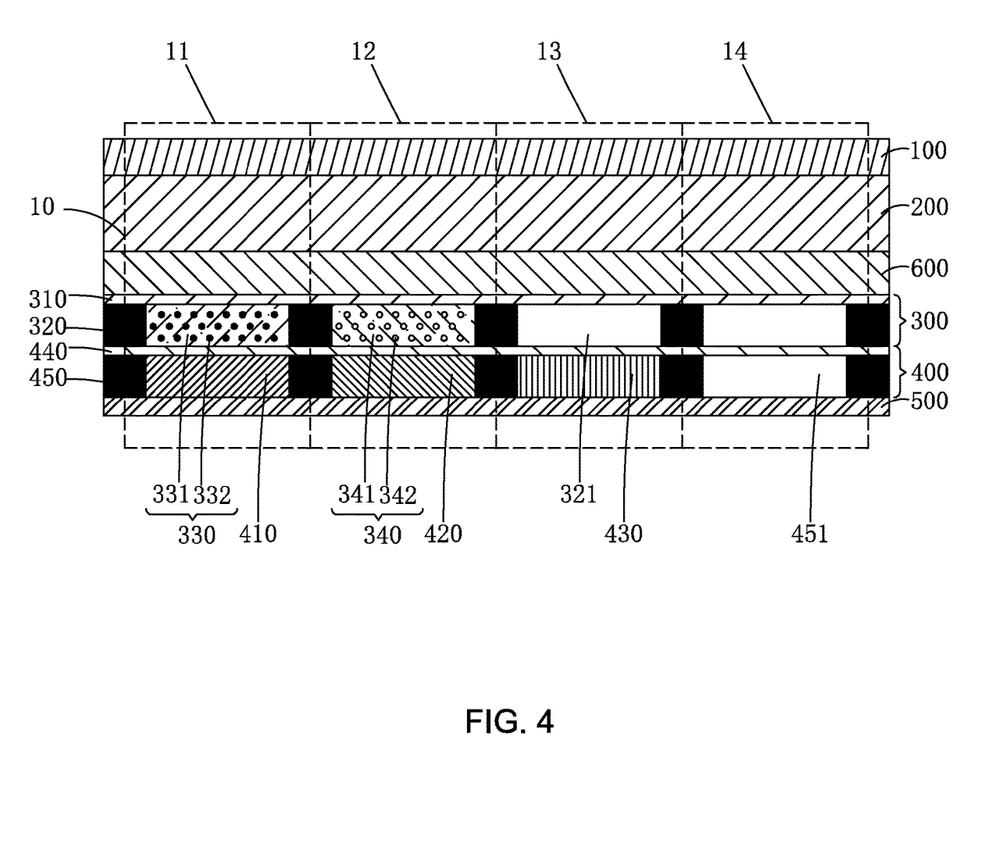
FIG. 4 is a structural diagram of the second embodiment of an organic light emitting diode display of the present invention.

Please refer to FIG. 4, which is the second embodiment of an OLED display of the present invention. The difference of the second embodiment from the aforesaid first embodiment is that, the quantum dot photoluminescence film 300 is disposed on the one side of the WOLED layer 200 away from the TFT substrate 100, and the encapsulation layer 600 is disposed between the WOLED layer 200 and the quantum dot photoluminescence film 300. Namely, the second embodiment of the OLED display of the present invention is a top emission type OLED display, and the WOLED layer 200 emits light from a side thereof away from the TFT substrate 100.

Correspondingly, in the second embodiment of the OLED display of the present invention, the WOLED layer 200 is first formed on the TFT substrate 100, and then the encapsulation layer 600 is formed on the WOLED layer 200, and then the quantum dot photoluminescence film 300, the color filter film 400 and the polarizer 500 are sequentially bonded to the side of the encapsulation layer 600 away from the WOLED layer 200 to produce an OLED display.

The reset is the same as the first embodiment. The repeated description is omitted here.

Specifically, in the OLED display of the present invention, the quantum dot photoluminescence film 300 is disposed on the light emitting side of the WOLED layer 200, and the red dot quantum dots 332 are configured in the region of the quantum dot photoluminescence film 300 corresponding to the red sub-pixel 11 of the OLED display, and the green quantum dots 342 are configured in the region corresponding to the green sub-pixel 12. Thus, when the OLED display is displayed, the white light emitted by the WOLED layer 200 is irradiated onto the red quantum dots 332 and the green quantum dots 342 in the quantum dot photoluminescence film 300. The short-wavelength portion of the white light spectrum, and particularly the portion of the blue light wavelength, can be absorbed by the red quantum dots 332 and the green quantum dots 342 to excite high-purity red and green light, respectively. The red light and the green light are respectively filtered by the red color resistance 410 and the green color resistance 420 in the color filter film 400, so that the red light emitting intensity and green light emitting intensity of the OLED display are increased, and the color saturation is increased, which improves the energy utilization. Under the same working brightness, the OLED display of the present invention has a lower operating current density than the prior art, which greatly reduces the power consumption of the OLED display, and makes the OLED display overall have higher color saturation to effectively broaden the color gamut of the OLED display and improve the display result.

In conclusion, the OLED display includes a thin film transistor substrate, a white OLED layer, a quantum dot photoluminescence film and a color filter film. The OLED display includes a plurality of sub-pixels, which are sequentially arranged. The sub-pixels include a red sub-pixel, a green sub-pixel and a blue sub-pixel. A region of the quantum dot photoluminescence film corresponding to the red sub-pixel is provided with red quantum dots, and a region corresponding to the green sub-pixel is provided with green quantum dots. The red quantum dots and the green quantum dots are excited by white light emitted by the WOLED layer to emit high-purity red light and green light, respectively, and then filtered by the color filter film to be emitted. Thus, the OLED display has higher color saturation, which effectively broadens color gamut of the OLED display and can fully utilize the short-wavelength light in the white light, thereby improving the energy utilization rate and making the OLED display have lower power consumption.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An organic light emitting diode display, comprising a thin film transistor substrate, a white organic light emitting diode layer disposed on one side of the thin film transistor substrate, a quantum dot photoluminescence film disposed on one side of the thin film transistor substrate away from the white organic light emitting diode layer or on one side of the white organic light emitting diode layer away from the thin film transistor substrate and a color filter film disposed on one side of the quantum dot photoluminescence film away from the white organic light emitting diode layer; wherein the quantum dot photoluminescence film is located on a light exit side of the white organic light emitting diode layer;

wherein the organic light emitting diode display comprises a plurality of sub-pixels arranged in sequence, and the plurality of sub-pixels comprise a red sub-pixel, a green sub-pixel and a blue sub-pixel;

wherein a region of the quantum dot photoluminescence film corresponding to the red sub-pixel is provided with red quantum dots, and a region corresponding to the green sub-pixel is provided with green quantum dots;

wherein the color filter film comprises a red color resistance, a green color resistance, and a blue color resistance respectively corresponding to the red sub-pixel, the green sub-pixel and the blue sub-pixel;

wherein the color filter film further comprises a second substrate and a second black matrix, and the second black matrix is disposed on the second substrate and are provided with a plurality of second openings corresponding to the plurality of sub-pixels, and the red color resistance, the green color resistance and the blue color resistance are all disposed on the second substrate, and the red color resistance is disposed in the second opening of the second black matrix corresponding to the red sub-pixel, and the green color resistance is disposed in the second opening of the second black matrix corresponding to the green sub-pixel, and the blue color resistance is disposed in the second opening of the second black matrix corresponding to the blue sub-pixel;

wherein the white organic light emitting diode layer comprises an anode, a hole injection layer, a first hole transport layer, a first light emitting layer, a first electron transport layer, a first electron generation layer, a first hole generation layer, a second hole transport layer, a second light emitting layer, a second electron transport layer, a second electron generation layer, a second hole generation layer, a third hole transport layer, a third light emitting layer, a third electron transport layer, an electron injection layer and a cathode, which are sequentially disposed.

2. The organic light emitting diode display according to claim 1, wherein the quantum dot photoluminescence film comprises a first substrate, a first black matrix disposed on the first substrate, a red quantum dot pattern and a green quantum dot pattern; the first black matrix is provided with a plurality of first openings corresponding to the plurality of sub-pixels; the red quantum dot pattern is disposed in the first opening of the first black matrix corresponding to the red sub-pixel, and the green quantum dot pattern is disposed in the first opening of the first black matrix corresponding to the green sub-pixel;

the red quantum dot pattern comprises a first polymer material and the red quantum dots doped in the first polymer material; the green quantum dot pattern comprises a second polymer material and the green quantum dots doped in the second polymer material.

3. The organic light emitting diode display according to claim 1, wherein the plurality of sub-pixels further comprises a white sub-pixel.

4. The organic light emitting diode display according to claim 1, further comprising a polarizer disposed on one side of the color filter film away from the white organic light emitting diode layer.

5. The organic light emitting diode display according to claim 1, further comprising an encapsulation layer disposed on one side of the white organic light emitting diode layer away from the thin film transistor substrate;

wherein as the quantum dot photoluminescence film is disposed on one side of the white organic light emitting diode layer away from the thin film transistor substrate, the encapsulation layer is disposed between the white organic light emitting diode layer and the quantum dot photoluminescence film.

6. The organic light emitting diode display according to claim 1, wherein the white organic light emitting diode layer comprises an anode, a hole injection layer, a first hole transport layer, a first light emitting layer, a first electron transport layer, an electron generation layer, a hole generation layer, a second hole transport layer, a second light emitting layer, a second electron transport layer, an electron injection layer and a cathode, which are sequentially disposed.

7. The organic light emitting diode display according to claim 6, wherein one of the first light emitting layer and the second light emitting layer is a yellow light emitting layer and the other is a blue light emitting layer; or one of the first light emitting layer and the second light emitting layer is a mixed light emitting layer of red light and green light and the other is a blue light emitting layer;

wherein the thin film transistor substrate is located on one side of the anode away from the cathode; or the thin film transistor substrate is located on one side of the cathode away from the anode.

8. The organic light emitting diode display according to claim 1, wherein the first light emitting layer and the third light emitting layer are both blue light emitting layers, and the second light emitting layer is a yellow light emitting layer; or the first light emitting layer, the second light emitting layer and the third light emitting layer respectively are one of a red light emitting layer, a green light emitting layer and a blue light emitting layer, and colors of the lights emitted by the first light emitting layer, the second light emitting layer and the third light emitting layer are different;
wherein the thin film transistor substrate is located on one side of the anode away from the cathode; or the thin film transistor substrate is located on one side of the cathode away from the anode.

\* \* \* \* \*